(12) United States Patent
Maeda et al.

(10) Patent No.: US 10,288,683 B2
(45) Date of Patent: May 14, 2019

(54) SEMICONDUCTOR DEVICE, ELECTRONIC CONTROL SYSTEM AND METHOD FOR EVALUATING ELECTRONIC CONTROL SYSTEM

(71) Applicant: Renesas Electronics Corporation, Tokyo (JP)

(72) Inventors: Yoichi Maeda, Tokyo (JP); Jun Matsushima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 56 days.

(21) Appl. No.: 15/493,311

(22) Filed: Apr. 21, 2017

(65) Prior Publication Data

US 2017/0343607 A1    Nov. 30, 2017

(30) Foreign Application Priority Data

May 30, 2016 (JP) ................................ 2016-107451

(51) Int. Cl.
| | | |
|---|---|---|
| *G01R 31/3187* | (2006.01) | |
| *G01R 31/28* | (2006.01) | |
| *G01R 31/3185* | (2006.01) | |
| *G01R 31/26* | (2014.01) | |

(52) U.S. Cl.
CPC . *G01R 31/318525* (2013.01); *G01R 31/2601* (2013.01); *G01R 31/318547* (2013.01)

(58) Field of Classification Search
CPC ............ G01R 31/2601; G01R 31/2884; G01R 31/3187; G01R 31/3193; G06F 11/22; G06F 11/267; G06F 11/25
See application file for complete search history.

(56) References Cited

U.S. PATENT DOCUMENTS 7,919,981 B2 * 4/2011 Irie ..................... G06F 17/5059
326/46
2012/0239993 A1    9/2012 Chung

FOREIGN PATENT DOCUMENTS

JP              01-169640 A         7/1989

OTHER PUBLICATIONS

Communication dated Nov. 7, 2017 from the European Patent Office in counterpart application No. 17173382.7.

* cited by examiner

*Primary Examiner* — Minh N Tang
(74) *Attorney, Agent, or Firm* — McDermott Will & Emery LLP

(57) ABSTRACT

In order to generate a false failure in a logic circuit without adding a new circuit to the logic circuit, a semiconductor device includes a plurality of test points includes a test point flip-flop to fix a target node within the logic circuit to a predetermined logic level when the flip-flop holds a predetermined value. A scan chain is configured by sequentially coupling a plurality of test point slip-flops. A failure injection circuit injects a failure into the target node during the normal operation of the logic circuit, by generating failure data and by setting the generated failure data to the scan chain through a scan-in node of the scan chain.

20 Claims, 15 Drawing Sheets

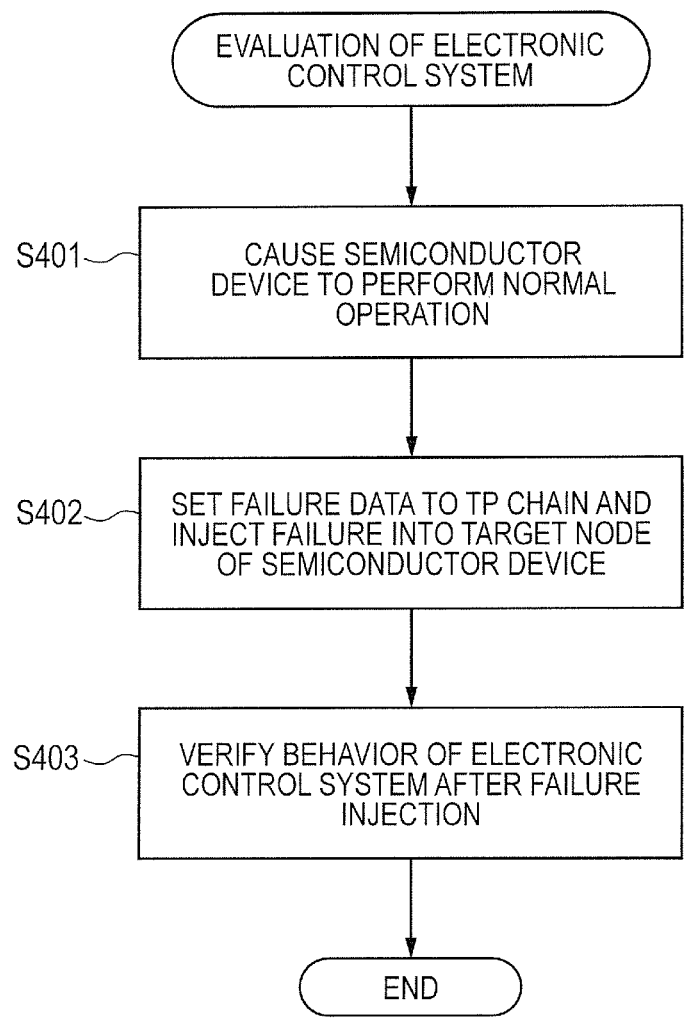

SEMICONDUCTOR DEVICE, ELECTRONIC CONTROL SYSTEM AND METHOD FOR EVALUATING ELECTRONIC CONTROL SYSTEM

CROSS-REFERENCE TO RELATED APPLICATIONS

The disclosure of Japanese Patent Application No. 2016-107451 filed on May 30, 2016 including the specification, drawings and abstract is incorporated herein by reference in its entirety.

BACKGROUND

The present invention relates to a semiconductor device, an electronic control system, and a method for evaluating the electronic control system. For example, the present invention relates to a semiconductor device to which functional safety is applied as well as a system including the semiconductor device.

For example, Patent Document 1 (Japanese Unexamined Patent Application Publication No. Hei 1(1989)-169640) discloses a method for generating false failures in an information processing device. More specifically, during the normal operation of an information processing device, a scan control unit forcibly scans predetermined data in a specific scan flip-flop within the information processing device. At this time, an address comparison circuit determines the timing of the scan-in operation by detecting that the value of a micro-instruction address register matches a predetermined address. Then, a decoder circuit decodes the predetermined scan address to identify the scan flip-flop which is the scan-in target.

SUMMARY

For example, with the advent of ISO 26262 which is a standard for functional safety of vehicles, there are an increasing number of semiconductor devices equipped with a self-diagnostic circuit for detecting their own failure. A system equipped with such a semiconductor device is configured, for example, to avoid the situation in which a serious problem occurs by performing various safety actions, in response to a detection of a failure by the self-diagnostic circuit, according to the type of the failure or other information. However, in general, the verification of whether the self-diagnostic circuit is normally operated, in other words, the verification of whether or not a failure is detected may not be performed until a failure actually occurs in the semiconductor device. For this reason, it is difficult to perform operations in the system development, such as, for example, debugging of software on the system for functional safety as well as the verification of whether functional safety is working properly.

Thus, for example, the method described in Patent Document 1 can be used in order to forcibly generate false failures in the semiconductor device. However, in this method, it is necessary to add a circuit for accepting the forced scan-in operation separately to each of the scan flip-flops included in various logic circuits. In this way, the addition of a new circuit to the logic circuit could possibly lead to the need to restart the layout design and various design verification processes.

While the following embodiments are made in view of these circumstances, other objects and novel features of the present invention will become apparent from the following description and the accompanying drawings.

A semiconductor device according to an embodiment is comprised of a single semiconductor chip. The semiconductor device includes a logic circuit having a predetermined function, a plurality of test points, a first scan chain, and a failure injection circuit. Each of the test points includes a test point flip-flop. When the flip-flop has a first value, the test point fixes the target node of the logic circuit to a predetermined logic level. The first scan chain is configured by sequentially coupling a plurality of test point flip-flops. The failure injection circuit injects a failure into a target node during the normal operation of the logic circuit, by generating failure data and setting the generated failure data to the first scan chain through a scan-in node of the first scan chain.

According to the embodiment described above, it is possible to generate false failures in the logic circuit, without adding a new circuit to the logic circuit.

BRIEF DESCRIPTION OF THE DRAWINGS

FIG. 16 is a flow chart illustrating an example of the evaluation method in the electronic control system according to the fourth embodiment of the present invention.

DETAILED DESCRIPTION

Figure 1:
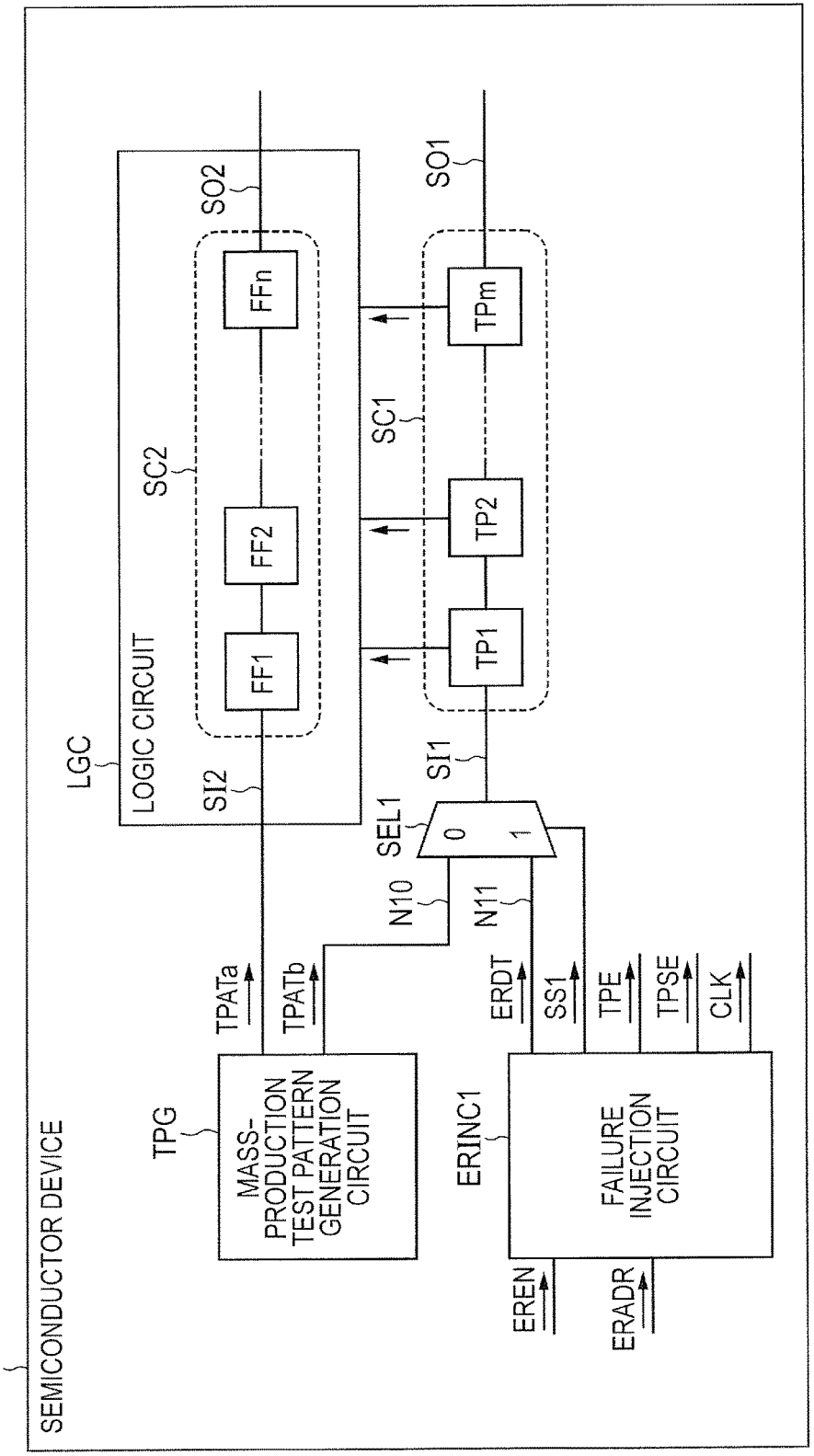
FIG. 1 is a circuit block diagram showing an outline configuration example of the main part in a semiconductor device according to a first embodiment of the present invention.

In the embodiments described below, the detailed description of the invention will be divided into a plurality of sections or embodiments, when required as a matter of convenience. However, these sections or embodiments are not irrelevant to each other unless otherwise stated, and one serves as a variation, a detailed description, or a supplementary explanation of the whole or part of the other. Also, in the embodiments described below, when referring to the number of elements (including the number of pieces, numerical value, amount, range, etc.), the number of elements is not limited to a specific number unless otherwise stated or it is clearly limited to a specific number in principle. The number of elements can be greater or smaller than the specified number.

Further, in the embodiments described below, it goes without saying that the components (including operation steps, etc.) are not necessarily needed unless otherwise stated or unless they should be clearly needed in principle. Similarly, in the embodiments described below, when referring to the shape, the positional relationship, or other characteristics of the components, those substantially close or similar to the shape or other characteristics are included unless otherwise stated or unless they are clearly considered not to be so in principle. This is also true for the number and range of elements.

Hereinafter, preferred embodiments of the present invention will be described in detail with reference to the accompanying drawings. Note that in all the drawings for describing the embodiments, like parts are basically designated by the same reference numerals and the repetitive description thereof will be omitted.

First Embodiment

<Semiconductor Device Configuration>

FIG. 1 is a circuit block diagram showing an outline configuration example of the main part in a semiconductor device according to a first embodiment of the present invention. A semiconductor device DEV is comprised of a single semiconductor chip, including a logic circuit LGC having a predetermined function, amass-production test pattern generation circuit TPG, a scan chain (which is referred to as TP chain in this specification) SC1, a failure injection circuit ERINC1, and a selection circuit SEL1.

The logic circuit LGC achieves a predetermined function by performing a normal operation while keeping values in a plurality of flip-flops FF1 to FFn. The logic circuit LGC has a scan chain (referred to as FF chain in this specification) SC2 that is configured by sequentially combining the flip-flops FF1 to FFn, as one of the Design For Test (DFT) functions. The FF chain SC2 is provided with a scan-in node SI2 and a scan-out node SO2. In this specification, the flip-flops FF1 to FFn are collectively referred to as the flip-flop FF.

The TP chain SC1 includes a plurality of test points TP1 to TPm. In this specification, the test points TP1 to TPm are collectively referred to as the test point TP. Although the details will be described later, the test point TP includes a test point flip-flop. When the test point flip-flop holds a predetermined value, the test point TP fixes a target node within the logic circuit LGC to a predetermined logic level (either "0" or "1" level). The TP chain SC1 is configured by sequentially combining the test point flip-flops that are included in each of the test points TP1 to TPm. The TP chain SC1 is provided with a scan-in node SI1 and a scan-out node SO1.

In general, as another DFT function, the semiconductor device DEV including the logic circuit LGC has a function called Test Point Insertion (TPI) that inserts a plurality of test points TP. The test point TP may be automatically generated by a DFT tool or may be arbitrarily inserted by a circuit designer or other person. The test point TP is typically provided to increase the failure detection rate of the logic circuit LGC in mass production of the semiconductor device DEV. The test point TP is never used in the normal operation of the semiconductor device DEV (the logic circuit LGC).

The mass-production test pattern generation circuit TPG generates test patterns for mass production TPATa and TPATb. The mass-production test pattern generation circuit TPG performs a scan test of the logic circuit LGC by outputting the mass production test pattern TPATa to the scan-in node SI2 of the FF chain SC2, and by outputting the mass production test pattern TPATb to the scan-in node SI1 of the TP chain SC1. Typically the mass-production test pattern generation circuit TPG includes various circuits for compressed scan test, or includes various circuits for logic Built In Self Test (BIST), and the like.

As a typical scan test method, the mass-production test pattern generation circuit TPG fixes the target node of the logic circuit LGC at a predetermined logic level by setting the mass production test pattern TPATb to the TP chain SC1. In this state, the mass-production test pattern generation circuit TPG scans the mass production test pattern TPATa in the FF chain SC2. Next, the mass-production test pattern generation circuit TPG operates a combination circuit (not shown) within the logic circuit LGC by capture. Then, the mass-production test pattern generation circuit TPG scans out the value of the FF chain SC2. In this way, for example, it is possible to perform the test in the state in which the target note is fixed at a predetermined logic level, although it is generally difficult to fix it at the predetermined logic level.

Note that the semiconductor device DEV does not necessarily include the mass-production test pattern generation circuit TPG. In other words, in some cases, the mass production test patterns TPATa and TPATb may be generated by automated test equipment (ATE) provided in the outside of the semiconductor device DEV, instead of by the mass-production test pattern generation circuit TPG. In this case, the ATE accesses each scan chain through a serial interface, such as, for example, a joint test action group (JTAG) that the semiconductor device DEV has.

The failure injection circuit ERINC1 injects a failure into the target node within the logic circuit LGC during the normal operation of the logic circuit LGC, by generating failure data ERDT, and by setting the failure data ERDT to the TP chain SC1 through the scan-in node SI1 of the TP chain SC1. Here, a failure injection enable signal EREN as well as a failure injection address ERADR are input to the failure injection circuit ERINC1. Then, the failure injection circuit ERINC1 outputs the failure data ERDT, selection signal SS1, TP enable signal TPE, TP scan enable signal TPSE, and clock signal CLK.

Here, although not shown, the TP enable signal TPE, the TP scan enable signal TPSE, and the clock signal CLK are coupled to the respective test points TP1 to TPm. The TP scan enable signal TPSE is only coupled to the test point TP, and is controlled independently of the scan enable signal that is coupled to the FF chain SC2 within the logic circuit LGC.

The selection circuit SEL1 selects, when the mass production test pattern TPATb is input to an input node N10 and the failure data ERDT is input to an input node N11, one of the input nodes N10 or N11 to couple to the scan-in node SI1. In this way, either of the failure data ERDT or the mass production test pattern TPATb to perform the scan test of the logic circuit LGC is input to the scan-in node SI1. The failure injection circuit ERINC1 controls the selection circuit SEL1 to select the input node N11 through the selection signal SS1.

As described above, the main feature of the semiconductor device DEV shown in FIG. 1 is that the TP chain SC1 is provided independently of the FF chain SC2 and that the failure injection circuit ERINC1 is provided. In general, each flip-flop FF within the FF chain SC2 and each test point TP within the TP chain SC1 can be integrated into a common scan chain, but here are separately provided in two scan chains.

This configuration allows the failure injection circuit ERINC1 to control the TP chain SC1 independently of the logic circuit LGC and to inject failures into the logic circuit LGC during the normal operation of the logic circuit LGC. In other words, the semiconductor device DEV can generate false failures by reusing the test point TP, which is generally used only in mass production, for example, after the mass production when the semiconductor device DEV has been shipped.

Note that the failure injection circuit ERINC1 is desirably provided within the semiconductor device DEV, but in some cases can be provided in the outside of the semiconductor device DEV. Further, it is also possible, for example, that the mass-production test pattern generation circuit TPG and the failure injection circuit ERINC1 are integrated into one circuit block so that the circuit block selectively outputs the mass production test pattern TPATb or the failure data ERDT into the scan-in node SI1 according to a predetermined selection signal. In this case, the circuit block has the equivalent function of the selection circuit SEL1.

<Failure Injection Circuit Configuration>

Figure 2:
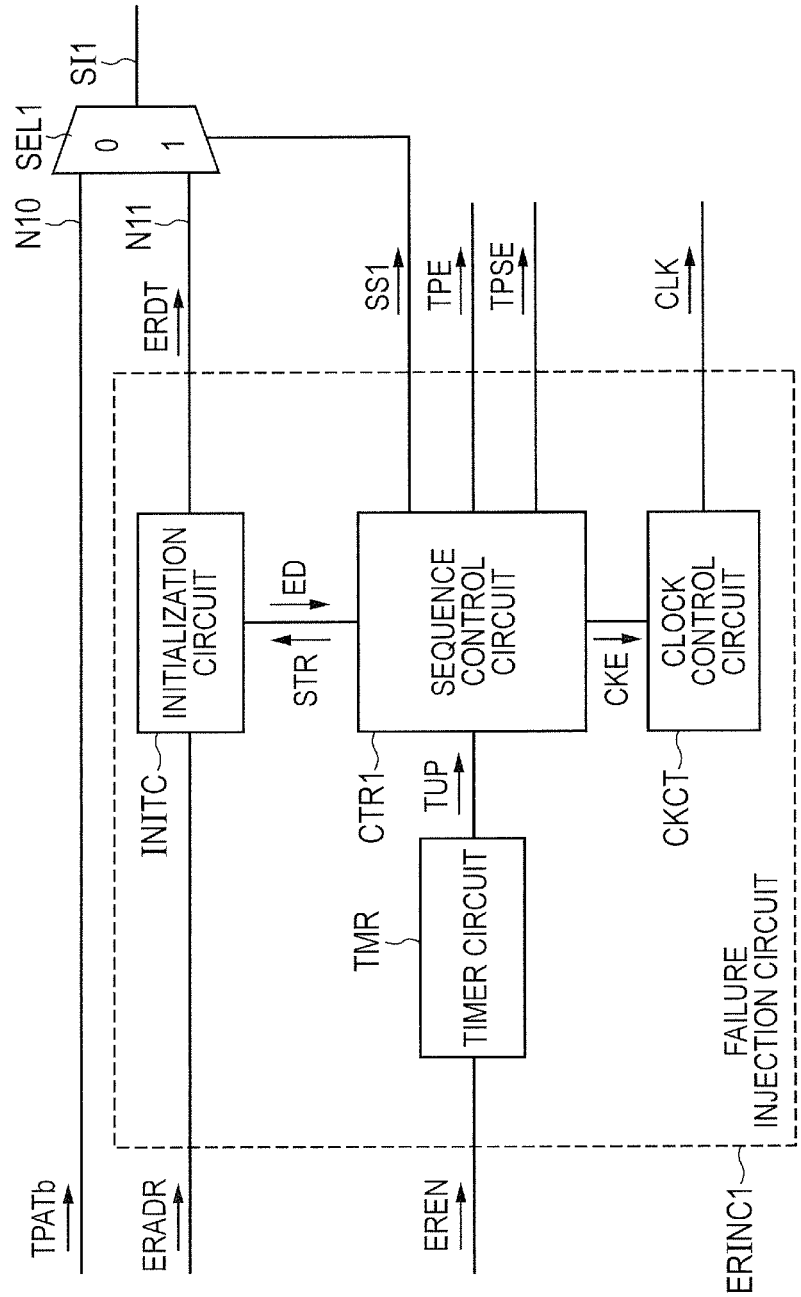
FIG. 2 is a circuit block diagram showing an outline configuration example of the failure injection circuit in FIG. 1.

FIG. 2 is a circuit block diagram showing an outline configuration example of the failure injection circuit ERINC1 shown in FIG. 1. The failure injection circuit ERINC1 in FIG. 2 includes a sequence control circuit CTR1, an initialization circuit INITC, a clock control circuit CKCT, and a timer circuit TMR. The timer circuit TMR starts a count operation at the time of the assertion of the failure injection enable signal. Then, the timer circuit TMR asserts a timer expiration signal TUP after a predetermined time has elapsed. The predetermined time can be a fixed value or a variable value that can be set from the outside of the failure injection circuit ERINC1. Further, although the details will be described later, the timer circuit TMR is used to delay the timing of the failure injection. If this is not needed, the semiconductor device may be configured to input the failure injection enable signal EREN directly to the sequence control circuit CTR1.

The sequence control circuit CTR1 starts operation upon assertion of the timer expiration signal TUP. The sequence control circuit CTR1 outputs the selection signal SS1 to the selection circuit SEL1. At the same time, the sequence control circuit outputs the TP enable signal TPE and the TP scan enable signal TPSE to the TP chain SC1. Further, the sequence control circuit CTR1 outputs an initialization start signal STR to the initialization circuit INITC, and outputs a clock enable signal CKE to the clock control circuit CKCT.

The initialization circuit INITC starts operation in response to the initialization start signal STR from the sequence control circuit CTR1. The initialization circuit INITC generates the failure data ERDT to inject a failure to the target node based on the failure injection address ERADR. Then, the initialization circuit INITC outputs the failure data ERDT serially to the selection circuit SEL1. Further, when the output of all failure data ERDT is completed (namely, when the setting of the failure data ERDT to the TP chain SC1 is completed), the initialization circuit INITC outputs an initialization completion signal ED to the sequence control circuit CTR1. The clock control circuit CKCT generates the clock signal CLK during the assertion of the clock enable signal CKE from the sequence control circuit CTR1 (or stops the generation of the clock signal CLK during the negation). Then, the clock control circuit CKCT supplies the generated clock signal CLK to the TP chain SC1.

<Test Point Configuration>

Figure 3:
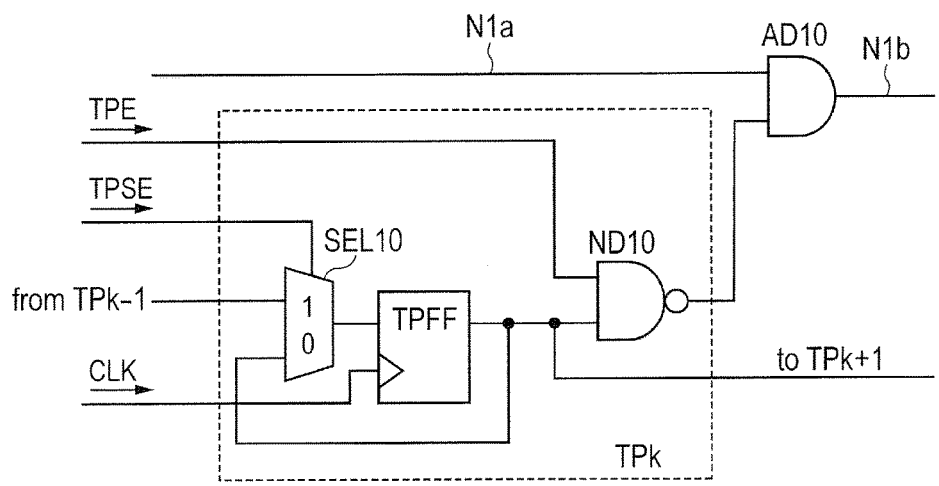
FIG. 3 is a circuit diagram showing a configuration example of the test point in FIG. 1.
Figure 4:
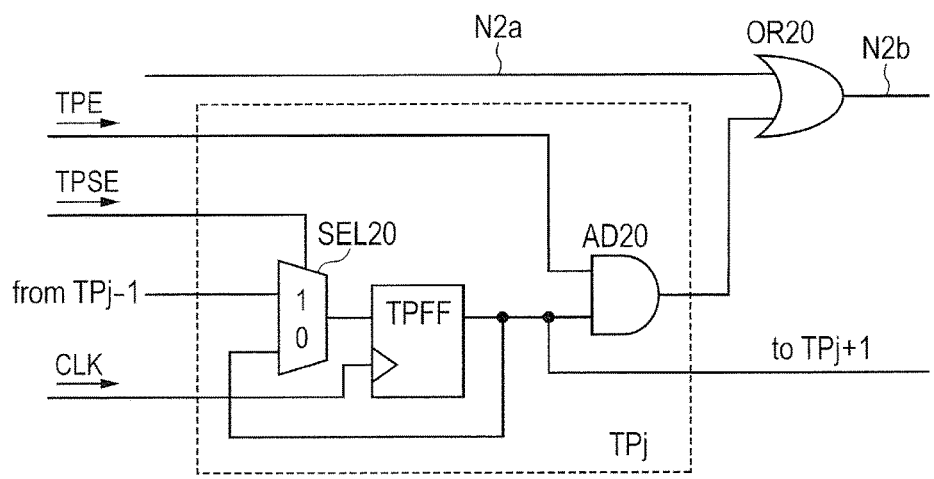
FIG. 4 is a circuit diagram showing a configuration example of the test point, which is different from the configuration shown in FIG. 3.

FIG. 3 is a circuit diagram showing an example of the configuration of the text point TP shown in FIG. 1. FIG. 4 is a circuit diagram showing an example of the configuration of the test point TP, which is different from the configuration in FIG. 3. A test point TPk shown in FIG. 3 is a circuit to fix a target node N1b of a signal path (between nodes N1a and N1b) within the logical circuit LGC, to '0' through an AND gate AD10 that is inserted into the signal path. The test point TPk has a test point flip-flop TPFF, a selection circuit SEL10, and an NAND gate ND10.

The test point flip-flop TPFF latches the output of the selection circuit SEL10 in synchronization with the TP scan enable signal CLK. The selection circuit SEL10 transmits the output value from the preceding test point TPk−1 (or more specifically, from the test point flip-flop TPFF of the test point TPk−1) during the assertion of the TP scan enable signal TPSE (here, '1'). Then, the selection circuit SEL10 returns the output of the test point flip-flop TPFF of the own stage during the negation of the TP scan enable signal TPSE (here, '0'). The NAND gate ND10 performs a logical operation between the TP enable signal TPE and the output of the test point flip-flop TPFF.

The AND gate AD10 is configured such that one of the two inputs is coupled to the node N1a, the calculation result of the NAND gate 10 is input to the other input, and the output is coupled to the node N1b. The calculation result of the NAND gate ND10 is '0' when the value of the test point flip-flop TPFF is '1' and during the assertion of the TP enable signal TPE (here, '1'). In this case, the node N1b is fixed to '0' regardless of the logic level of the node N1a. On the other hand, when the value of the test point flip-flop TPEE is '0' or during the negation of the TP enable signal TPE (here, '0'), the logic level of the node N1b is equal to the logic level of the node N1a.

A test point TPj shown in FIG. 4 is a circuit that fixes the target node N2b of the signal path (between the nodes N2a and N2b) within the logic circuit LGC1, to '1' through an OR gate OR20 that is inserted into the signal path. The test point TPj has a test point flip-flop TPFF, a selection circuit SEL20, and an AND gate AD20. In other words, in FIG. 4, the AND gate AD20 is provided instead of the NAND gate ND10, and the OR gate OR20 is provided instead of the AND gate AD10. In this way, similarly to the case of FIG. 3, the node N2b is fixed to '1' regardless of the logic level of the note N2a, when the value of the test point flip-flop TPFF is '1' and during the assertion of the TP enable signal TPE. Otherwise, the logic level of the node N2b is equal to the logic level of the node N2a.

Note that the test point TP is not particularly limited to the configurations shown in FIGS. 3 and 4. For example, the test point TP can be configured such that a predetermined fixed value, instead of its own value, is input to the test point flip-flop TPFF during the negation of the TP scan enable signal TPSFE. Further, it is also possible to directly input the output value from the test point flip-flop TPFF of the previous stage into the test point flip-flop TPFF of its own stage, without providing the selection circuits SEL10 and SEL20. Various other configurations are known as the test point TP and can be applied accordingly.

<Semiconductor Device Operation>

Figure 5:
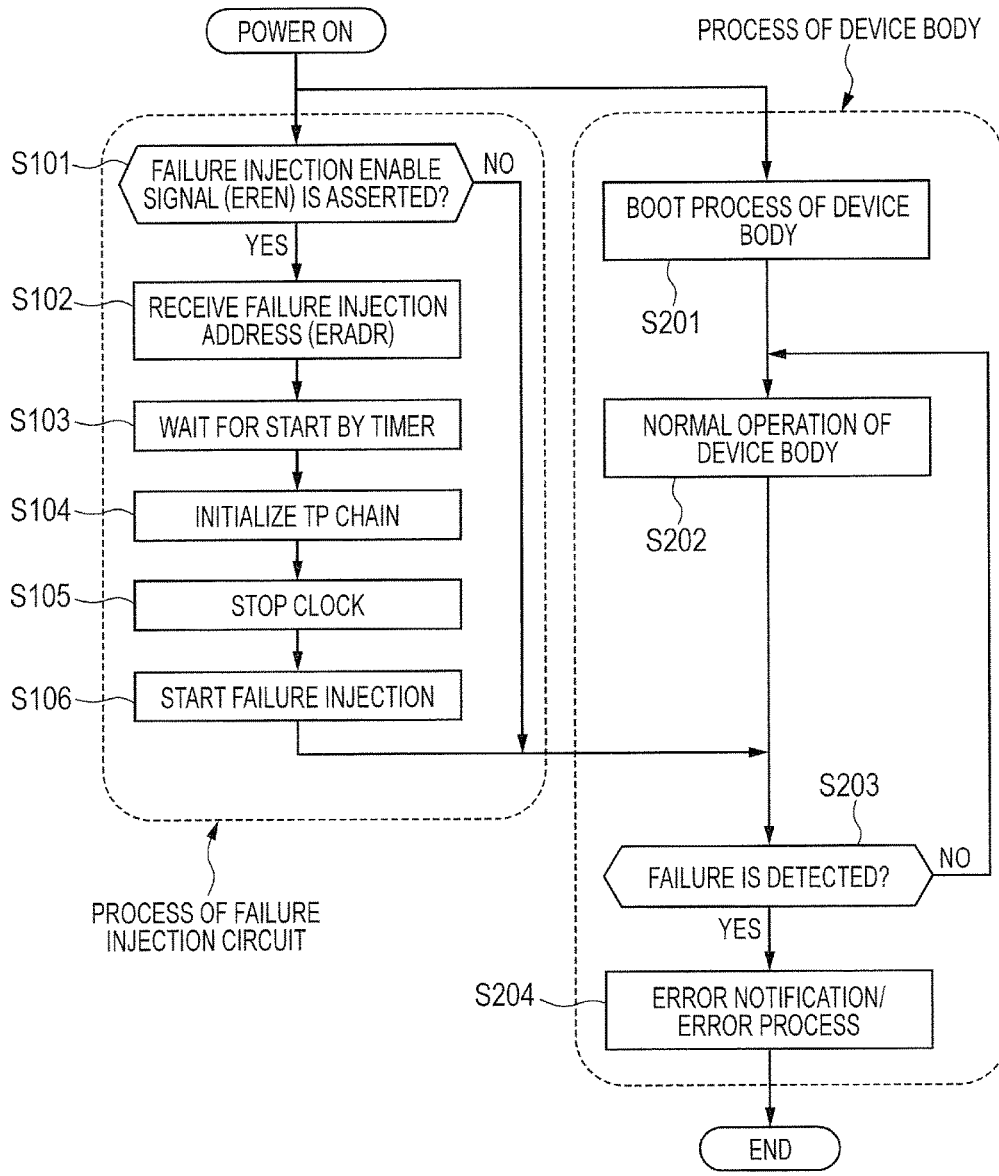
FIG. 5 is a flow chart illustrating an example of the operation of the semiconductor device of FIG. 1.
Figure 6:
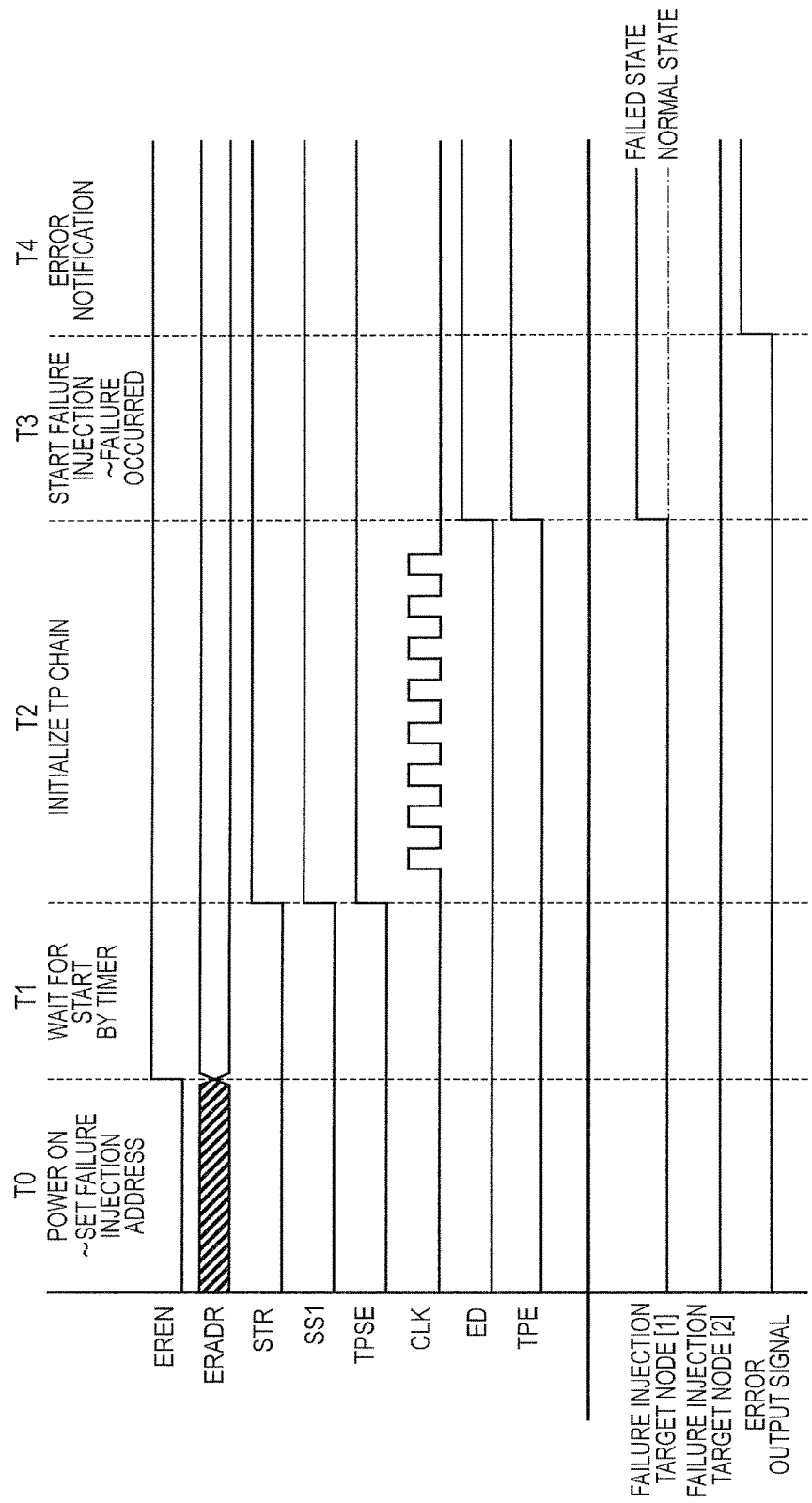
FIG. 6 is a waveform diagram showing an example of the internal waveform of the semiconductor device of FIG. 1, which is complementary to FIG. 5.

FIG. 5 is a flow chart illustrating an example of the operation of the semiconductor device shown in FIG. 1. FIG. 6 is a waveform diagram illustrating an example of the internal waveform of the semiconductor device shown in FIG. 1. In FIG. 5, when the semiconductor device DEV is powered on, the failure injection circuit ERINC1 and the body of the semiconductor device (referred to as the device body), which is mainly comprised of the logic circuit LGC, operate independently of each other. After the power on, through a predetermined activation process (for example, the execution of a boot program or the like) (step S201), the device body performs the normal operation (step S202).

Although not shown in FIG. 1, the device body also includes a functional safety circuit (or a self-diagnostic circuit). When a failure occurs in the logic circuit LGC or other components during the normal operation of the device body, the functional safety circuit detects the failure (step S203), and performs the operations such as an error notification to the outside of the device as well as a predetermined error process within the device (step S204). The error process includes, for example, an internal reset of the part (the logic circuit LGC or the like) where the failure is detected, but it is not particularly limited thereto.

The failure injection circuit ERINC1 determines whether the failure injection enable signal EREN is asserted or negated after the power on (step S101). When the failure injection enable signal EREN is negated, the failure injection circuit ERINC1 does not start a failure injection operation and does virtually nothing. On the other hand, when the failure injection enable signal EREN is asserted, the failure injection circuit ERINC1 starts the failure injection operation and receives the failure injection address ERADR (step S102). Here, for example, the methods for determining the failure injection enable signal EREN and the failure injection address ERADR are as follows: Determine through an external input of the semiconductor device DEV immediately after powered on; and automatically determine within the device by using a non-volatile memory included in the semiconductor device DEV. Here, the description assumes the use of the latter method.

In the latter method, for example, a memory area to store a failure injection flag that determines whether the failure injection is performed as well as the failure injection address ERADR, is provided in advance in a non-volatile memory in which an arbitrary value can be written from the outside of the semiconductor device DEV. When wanting to operate the failure injection circuit ERINC1, the user writes the failure injection flag and the failure injection address ERADR into the non-volatile memory in advance.

In this state, the semiconductor device DEV is powered on. Then, the semiconductor device DEV performs the boot program in a period T0 in FIG. 6. Then, the semiconductor device DEV reads the memory area of the failure injection flag in the boot program. When the failure injection flag is written in the memory area, the semiconductor device DEV also reads the failure injection address ERADR, and outputs the failure injection address ERADR to the failure injection circuit ERINC1. At the same time, the semiconductor device DEV asserts the failure injection enable signal EREN. In response to this, the failure injection circuit ERINC1 starts a failure injection operation.

On the other hand, when the failure injection flag is not written in the memory area, the semiconductor device DEV keeps the failure injection enable signal EREN negated, so that the failure injection circuit ERINC1 does not start the failure injection operation. In this way, the failure injection circuit ERINC1 operates when the failure injection flag is stored in a predetermined memory area of the non-volatile memory, and does not operate when the failure injection flag is not stored in the particular memory area.

When the failure injection enable signal EREN is asserted, the failure injection circuit ERINC1 receives the failure injection address ERADR (step S102), while starting the timer circuit TMR as shown in a period T1 of FIG. 6 and waiting for the elapse of a predetermined time (step S103). The predetermined time is, for example, the waiting time until the device body reaches the normal operation (step S202).

When the predetermined time has elapsed, the timer circuit TMR asserts the timer expiration signal TUP. In response to this, the sequence control circuit CTR1 asserts the initialization start signal STR and the TP scan enable signal TPSE as shown in the period T1 to period T2 in FIG. 6. At the same time, the sequence control circuit CTR1 couples the output of the initialization circuit INITC to the scan-in node SI1 through the selection signal SS1. Further, the sequence control circuit CTR1 asserts the clock enable signal CKE as well.

In response to the assertion of the initialization start signal STR, the initialization circuit INITC initializes the TP chain SC1 (step S104). Further, in response to the assertion of the clock enable signal CKE, the clock control circuit CKCT supplies the clock signal CLK for initialization to the TP chain SC1 as shown in the period T2 in FIG. 6.

In step S104, the initialization circuit INITC first generates the failure data ERDT. The failure data ERDT is a bit string with the same length as the number of test points TP (m bits in the example of FIG. 1), in which '1' is set to a specific one bit and '0' is set to the remaining bits. The specific one bit is determined by the failure injection address ERADR. Next, as shown in the period T2 in FIG. 6, the initialization circuit INITC sifts the generated failure data ERDT one bit by one bit in the TP chain SC1. When the shift-in operation is completed, the initialization circuit INITC asserts the initialization completion signal ED.

As described above, the initialization circuit INITC generates the failure data ERDT so that one of the test point flip-flops TPFF holds '1', and sets the failure data ERDT to the test point flip-flop TPFF. As a result, the state in which '1' is set to only one of the test point flip-flops TPFF and '0' is set to the remaining flip-flops is established.

In response to the assertion of the initialization completion signal ED, the sequence control circuit CTR1 negates the clock enable signal CKE. In response to this, the clock control circuit CKCT stops the supply of the clock signal CLK as shown in the period from T2 to T3 in FIG. 6 (step S105). As a result, the failure data ERDT set to the test point TP is fixed. Then, the sequence control circuit CTR1 starts a failure injection by asserting the TP enable signal TPE as shown in the period from T2 to T3 in FIG. 6 (step S106). In other words, a stack failure of '0' or '1' is injected into the target node of the test point TP in which '1' is set to the test point flip-flop TPFF.

FIG. 6 is an example of having two target nodes of failure injection (in other words, the number of test points TP is two). This figure schematically shows a state in which a failure is injected to either of the target nodes [1] and [2] (here, the target node [1]). In this example, the target node is in the normal state with '0' and in the failed state with '1'. In steps S203 and S204 in FIG. 5, the functional safety circuit detects a failure of the target node [1] and outputs an error output signal as shown in the period from T3 to T4 in FIG. 6.

<Main Advantage of First Embodiment>

As described above, the first embodiment achieves a failure injection into the semiconductor device (logic circuit LGC) after mass production by using the test point TP, which is provided as one of the DFT functions for mass production, to allow the control signal of the particular test point TP to be driven also after mass production. With this configuration, it is possible to generate false failures in the logic circuit LGC without adding an addition circuit to the logic circuit LGC.

As a comparative example, the method of Patent Document 1 is, for example, a method that generates a false failure in a specific flip-flop FF by adding a predetermined circuit to the FF chain SC2 shown in FIG. 1. In this case, it is necessary to add an additional circuit to the logic circuit LGC, so that the need to restart the layout design and various types of design verification may arise. On the other hand, in the first embodiment, the addition of a circuit to the logic circuit LGC is not particularly required, and thus it is possible to avoid such a problem.

Further in the method of Patent Document 1, it is necessary to add a circuit that monitors the value of the program counter, and a decoder circuit or other circuits to the logic circuit LGC such as processor, in addition to the FF chain SC2. In this case, it is not suitable for the case of requiring a plurality of circuits with the same configuration, such as lock step dual core.

When the circuits are only added to the master core into which a failure is artificially injected, the circuitry and layout of the master core is different from those of the checker core, so that the intended purpose of the lock step dual core may not be achieved. On the other hand, when the circuits are added to both the master core and the checker core, a failure is injected into both cores. As a result, the purpose of wanting to inject a failure only to the master core may not be achieved. The method of the first embodiment can easily achieve injection of failures only into the master core by setting the failure data ERDT to the TP chain SC1 of the master core.

Further, the method of the first embodiment uses the exiting test point TP, so that failure injection into a large number of logic circuits LGC may be achieved by a small number of circuit overheads. Note that the operation shown in FIGS. 5 and 6 can reproduce persistent failure. In other words, it is possible to reproduce the state in which one particular target node is always fixed to '0' or '1'. In this way, the semiconductor device to which functional safety is applied, as well as the system equipped with the semiconductor device can verify whether functional safety operates normally in the event of persistent failure (such as, for example, whether the semiconductor device and the system can avoid the occurrence of system failure or other malfunction). In addition, it is possible to perform verification in the system development, such as, for example, debugging software associated with functional safety on the system while appropriately injecting failures.

Second Embodiment

<Semiconductor Device Configuration (Variation)>

Figure 7:
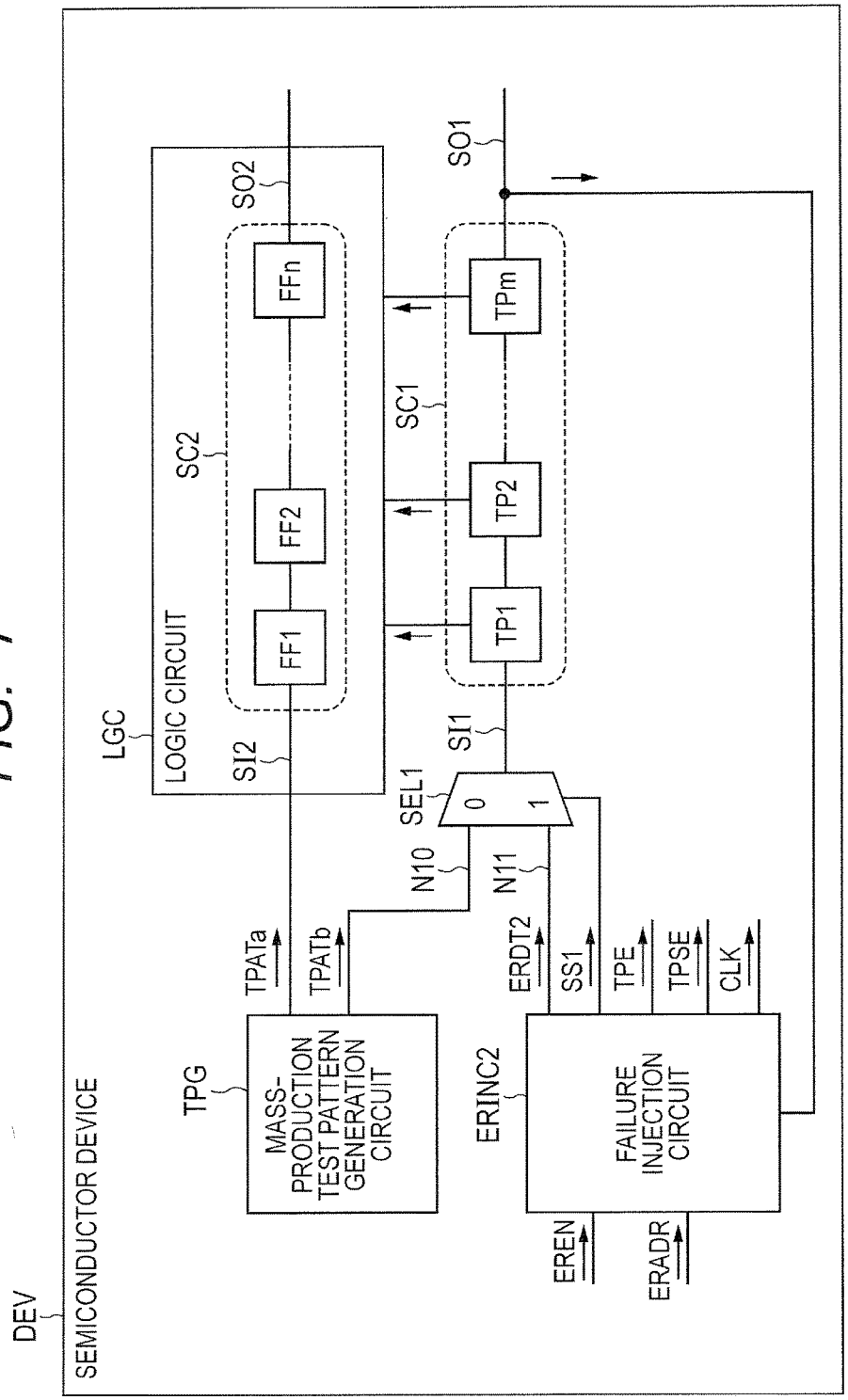
FIG. 7 is a circuit block diagram showing an outline configuration example of the main part in a semiconductor device according to a second embodiment of the present invention.

FIG. 7 is a circuit block diagram showing an outline configuration example of the main part in a semiconductor device according to a second embodiment of the present invention. A semiconductor device DEV of FIG. 7 differs in the following two points compared with the configuration example of FIG. 1. The first point is that the internal configuration of a failure injection circuit ERINC2 differs from that of FIG. 1, and the second point is that the scan-out node SO1 of the TP chain SC1 is coupled to the failure injection circuit ERINC2. The failure injection circuit ERINC2 outputs failure data ERDT2 that is different from the case in FIG. 1.

<Failure Injection Circuit Configuration (Variation)>

Figure 8:
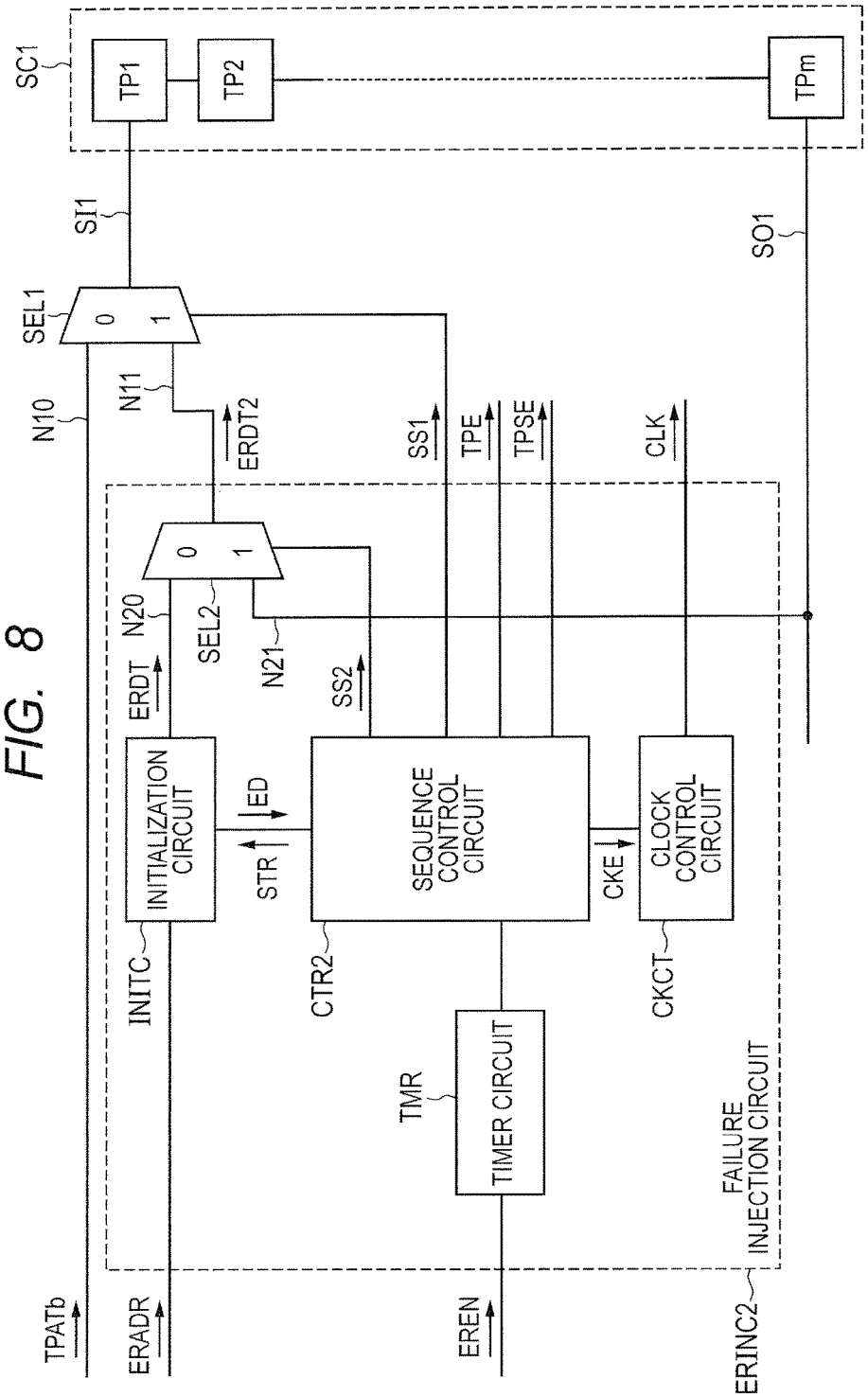
FIG. 8 is a circuit block diagram showing an outline configuration example of the failure injection circuit in FIG. 7.

FIG. 8 is a circuit block diagram showing an outline configuration example of the failure injection circuit in FIG. 7. The failure injection circuit ERINC2 shown in FIG. 8 differs in the following two points compared with the configuration example of FIG. 2. The first point is that a selection circuit SEL2 is additionally provided, and the second point is that the configuration and operation of a sequence control circuit CTR2 differ due to the addition of the selection circuit SEL2.

The selection circuit SEL2 is configured such that the failure data ERDT from the initialization circuit INITC is input to an input node N20 and the scan-out node SO1 of the TP chain SC1 is coupled to an input node N21. The selection circuit SEL2 selects either the input node N20 or the input node N21, and then couples to the input node N11 of the selection circuit SEL1. The sequence control circuit CTR2 outputs a selection signal SS2 of the selection circuit SEL2, in addition to various signals (STR, SS1, TPE, TPSE, CKE), similarly to the case of FIG. 2.

<Semiconductor Device Configuration (Variation)>

Figure 9:
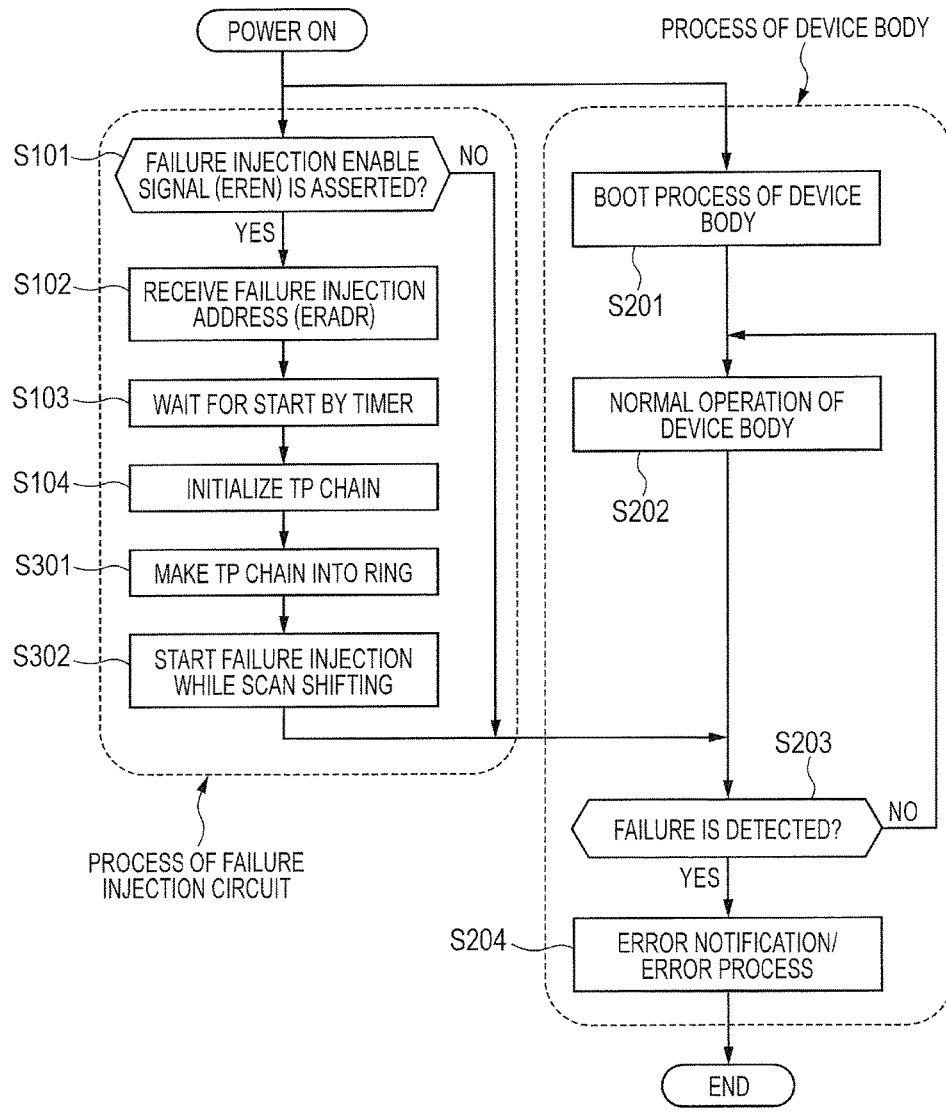
FIG. 9 is a flow chart illustrating an example of the operation of the semiconductor device of FIG. 7.
Figure 10:
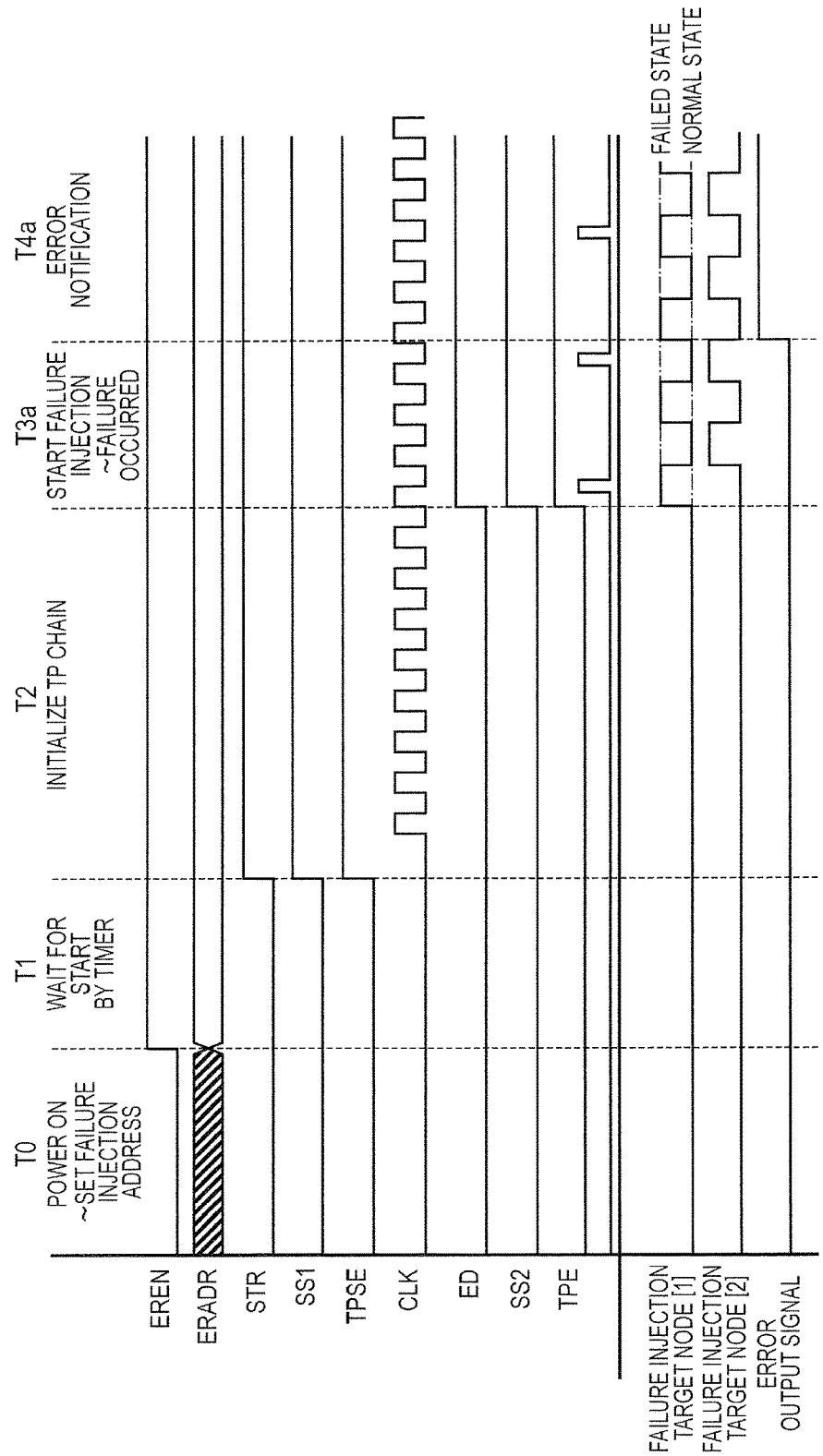
FIG. 10 is a waveform diagram illustrating an example of the internal waveform of the semiconductor device of FIG. 7, which is complementary to FIG. 9.

FIG. 9 is a flow chart illustrating an example of the operation of the semiconductor device shown in FIG. 7. FIG. 10 is a waveform diagram illustrating an example of the internal waveform of the semiconductor device of FIG. 7, which is complementary to FIG. 9. First, the failure injection circuit ERINC2 of FIG. 8 generally controls the selection circuit SEL2 to select the input node N20. Then, similarly to the case of the first embodiment, the failure injection circuit ERINC2 generates and sets the failure data ERDT so that one of the test point flip-flops TPFF holds '1'. Next, the failure injection circuit ERINC2 generates the failure data ERDT2 to inject failures while changing the target node, by controlling the selection circuit SEL2 to select the input node N21, and by allowing the test point flip-flop holding '1' to circulate while scanning by shifting the TP chain SC1.

More specifically, in FIG. 9, the process content of the device body (steps S201 to 204) and the process content until the initialization of the TP chain SC1 in the failure injection circuit ERINC2 are the same as those in the case of FIG. 5. Also, in FIG. 10, the waveform in the period until the initialization of the TP chain SC1 (in the period from T0 to T2) is the same as the case of FIG. 6.

In FIG. 9, the sequence control circuit CTR2 receives the assertion of the initialization completion signal ED from the initialization circuit INITC (step S104). In response to this assertion, the sequence control circuit CTR2 performs the process of step S301. In step S301, the sequence control circuit CTR2 maintains the assertion of the clock enable single CKE, and controls the scan-out node SO1 of the TP chain SC1 to be coupled to the scan-in node SC1. In other words, the sequence control circuit CTR2 makes the TP chain SC1 into a ring.

Next, when the sequence control circuit CTR2 asserts the TP enable signal TPE, the failure injection circuit ERINC2 starts a failure injection while scanning by shifting the TP chain SC1 (step S302). More specifically, the failure injection circuit ERINC2 sequentially moves the test point TP with '1' set to the test point flip-flop TPFF (in other words, the activated test point TP) to the subsequent stage in conjunction with the clock signal CLK. Further, since the TP chain SC1 is made into a ring, the activated test point TP circulates around the TP chain SC1. In response to this, the target node of the failure injection also moves cyclically.

FIG. 10 is an example of having two target nodes of failure injection (in other words, the number of test points TP is two). This figure schematically shows a state in which a failure is cyclically injected into the target nodes [1] and [2]. In this example, the number of target nodes is two, so that the normal state (here, '0') and the failed state (here, '1') are alternately switched in the target nodes [1] and [2] in conjunction with the clock signal CLK as shown in the periods T3a and T4a. In steps S203 and S204 in FIG. 9, the functional safety circuit detects failure in the target nodes [1] and [2], and outputs an error signal as shown in the period from T3a to T4a in FIG. 10.

<Main Advantage of Second Embodiment>

As described above, different from the method of the first embodiment, the method of the second embodiment continuously generates an intermittent failure, namely, a transient failure in which once the target node goes into a failed state and then returns to a normal state, while changing the target node. In this way, in addition to the various advantages described in the first embodiment, the semiconductor device to which functional safety is applied as well as the system equipped with the semiconductor device can verify whether functional safety operates normally (such as, for example, whether the semiconductor device and the system can avoid system failure or other malfunction) in the event of intermittent failure. Note that because such an intermittent failure may return to the normal state before the failure appears as a system failure, the method continuously generates failures while changing the target node in order to facilitate the generation of failures.

Third Embodiment

Semiconductor Device Configuration (Application Example)

Figure 11:
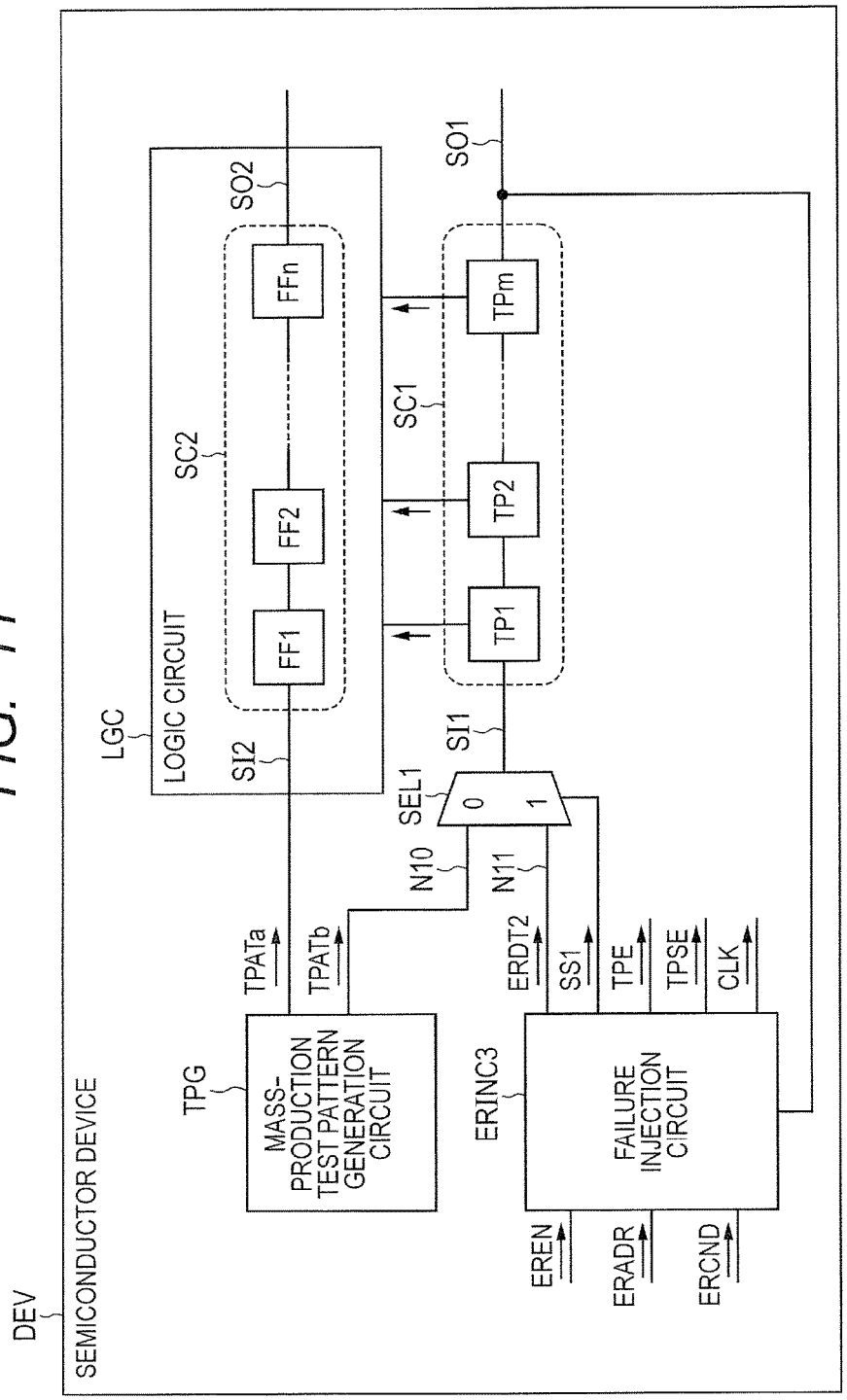
FIG. 11 is a circuit block diagram showing an outline configuration example of the main part in a semiconductor device according to a third embodiment of the present invention.

FIG. 11 is a circuit block diagram showing an outline configuration example of the main part in a semiconductor device according to a third embodiment of the present invention. A semiconductor device DEV shown in FIG. 11 is different in the internal configuration of a failure injection circuit ERINC3, compared with the configuration example of FIG. 7. A failure injection condition ERCND is input to the failure injection circuit ERINC3 in order to variably set the failure injection period and the failure injection interval.

Failure Injection Circuit Configuration (Application Example)

Figure 12:
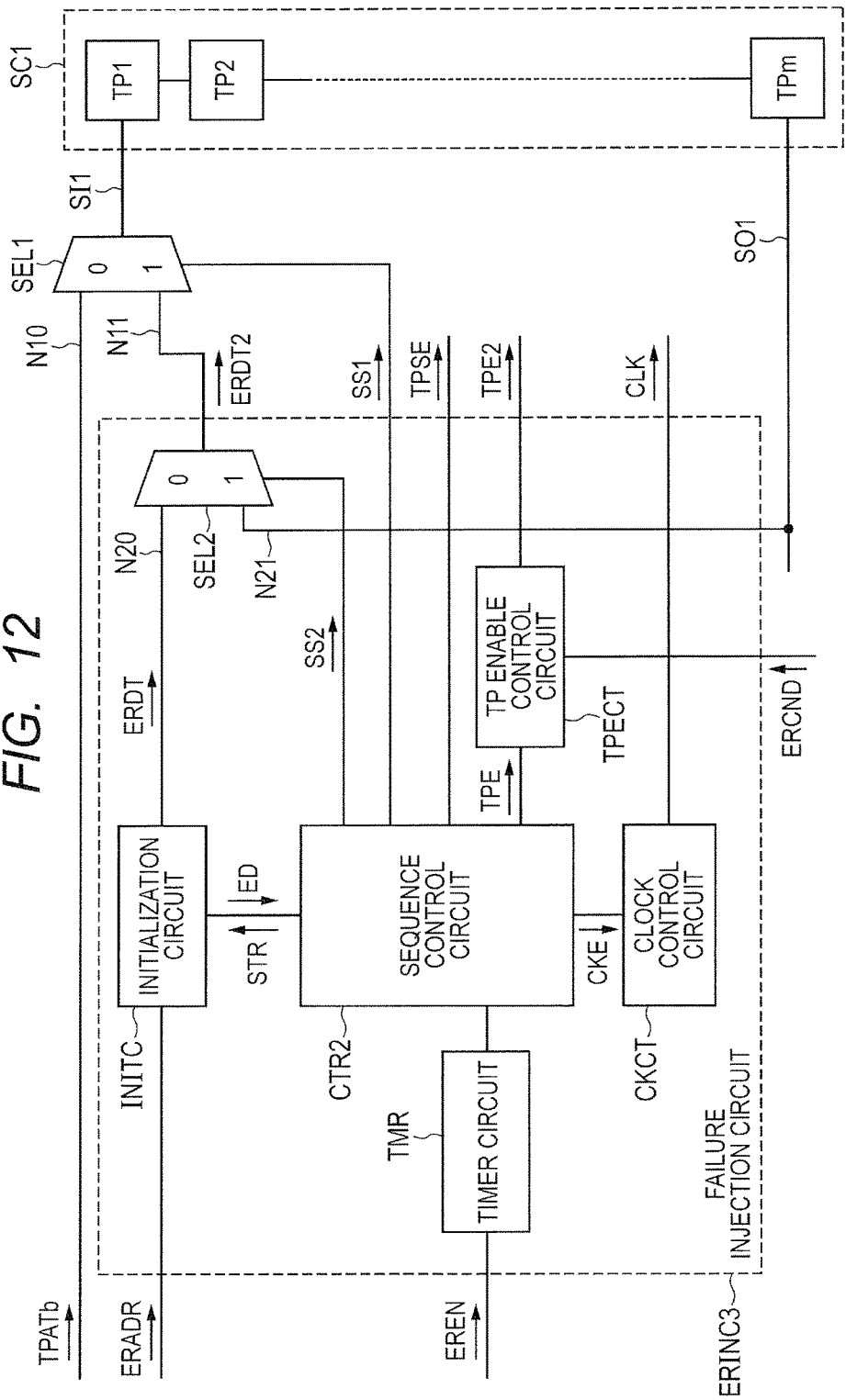
FIG. 12 is a circuit block diagram showing an outline configuration example of the failure injection circuit in FIG. 11.

FIG. 12 is a circuit block diagram showing an outline configuration example of the failure injection circuit ERINC3 shown in FIG. 11. The failure injection circuit ERINC3 shown in FIG. 12 is different in that a TP enable control circuit TPECT is added, compared with the configuration example of FIG. 8. In response to the assertion of the TP enable signal TPE from the sequence control circuit CTR2, the TP enable control circuit TPECT outputs a TP enable signal TPE2 whose pulse width and pulse interval are adjusted according to the failure injection condition ERCND, to the TP chain SC1. In this way, the TP enable control circuit TPECT determines the period in which the failure is injected in the failure injection while changing the target node, as well as the interval in which the failure is injected according to the setting.

Semiconductor Device Operation (Application Example)

Figure 13:
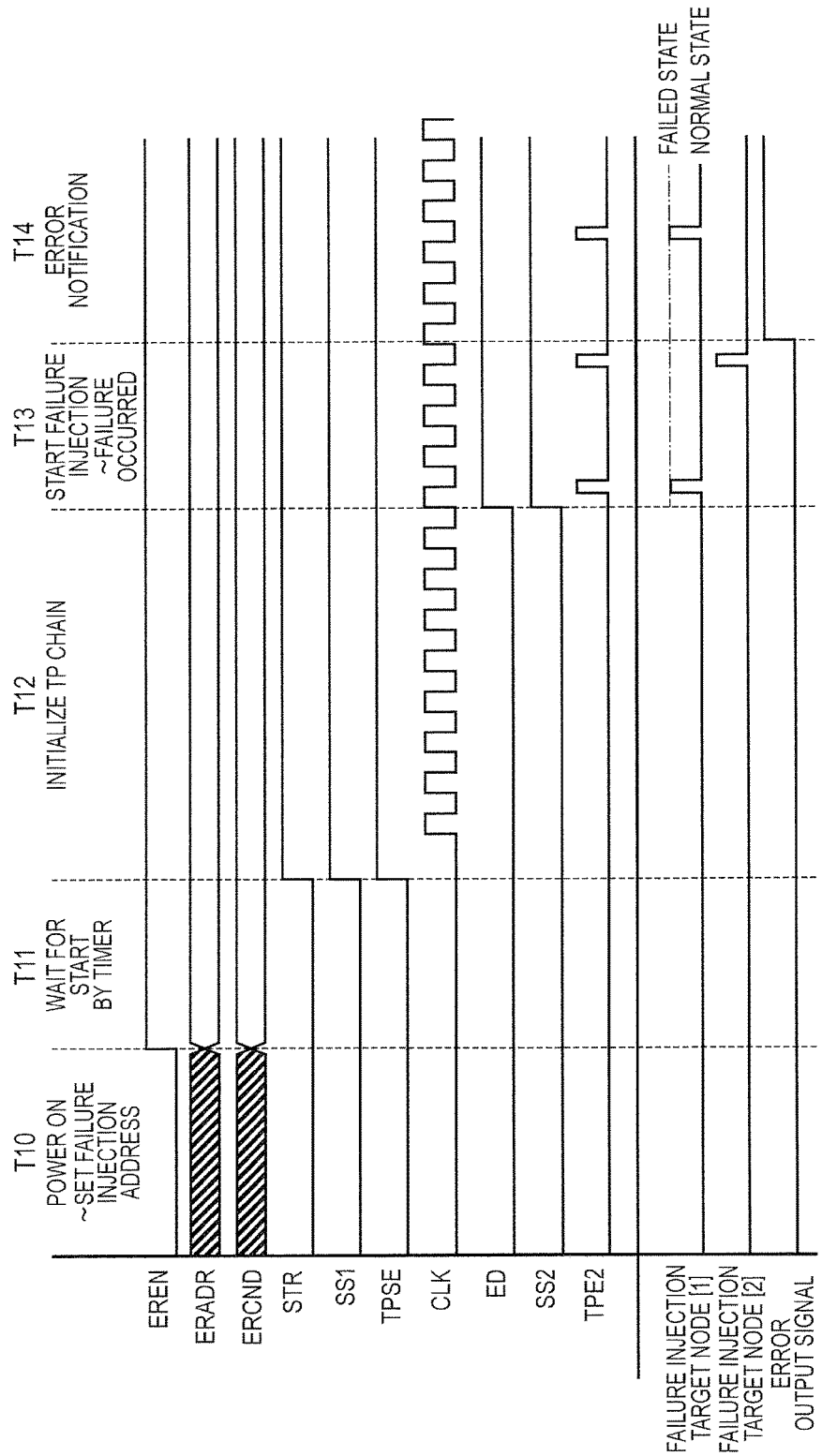
FIG. 13 is a waveform diagram showing an example of the internal waveform in the operation of the semiconductor device of FIG. 11.

FIG. 13 is a waveform diagram showing an example of the internal waveform in the operation of the semiconductor device shown in FIG. 11. In FIG. 13, in the period from T10 to T12, substantially the same process as that of the period from T0 to T2 in FIG. 10 is performed. However, in the period T10, the failure injection condition ERCND is input to the failure injection circuit ERINC3, in addition to the failure injection address ERADR. The failure injection condition ERCND is input in the same way as in the case of the failure injection address ERADR described previously. In other words, it is possible to use methods, such as externally inputting the condition after power on, or reading the failure injection condition ERCND that is written in advance into a predetermined memory area of the non-volatile memory, after power on.

In the periods T13 and T14 in FIG. 13, the TP enable control circuit TPECT generates the TP enable signal TPE2 with a waveform different from the waveform in the periods T3a and T4a in FIG. 10. In this example, the TP enable control circuit TPECT asserts the TP enable signal TPE2 per cycles of the clock signal CLK during a predetermined time period. The number of cycles and the predetermined time period are set according to the failure injection condition ERCND. Although not particularly limited thereto, for example, the TP enable control circuit TPECT is comprised of a counter that counts the number of cycles, as well as a pulse generation circuit that generates one-shot pulse with a predetermined pulse width in response to the output of the counter.

By using such a TP enable signal TPE2, it is possible to determine the generation period of each failure unlike the case of FIG. 10, while moving the target node of failure injection similarly to the case of FIG. 10. In addition, it is possible to set the period in which no failure occurs between the movements. In other words, as shown in FIGS. 3 and 4, the test point TP generates a stack failure with '0' or '1' in the target node during the assertion period of the TP enable signal TPE2, and does not generate a stack failure during the negation period of the TP enable signal TPE2.

<Main Advantage of Third Embodiment>

As described above, compared with the method of the second embodiment, the method of the third embodiment further controls the period in which the failure is injected as well as the interval in which the failure is injected. Thus in the second embodiment, in addition to the various advantages described in the first and second embodiments, the semiconductor device to which functional safety is applied as well as the system equipped with the semiconductor device can verify whether functional safety operates normally in the event of accidental failure (such as, for example, whether the semiconductor device and the system can avoid system failure or other malfunction). The accidental failure is a temporary failure that accidentally occurs, for example, due to the influence of alpha rays and noise.

Note that, here, the TP enable control circuit TPET is added to the configuration example of FIG. 8. Similarly, the TP enable control circuit TPECT can also be added to the configuration example of FIG. 2. In this case, the TP enable control circuit TPECT controls the period in which the failure is injected based on the failure injection condition. As a result, although the target node [1] of failure injection is always in a failed state in the periods T3 and T4 in FIG. 6, it is possible to control the period of such a failed state based on the failure injection condition.

Fourth Embodiment

<Configuration of Electronic Control System>

Figure 14:
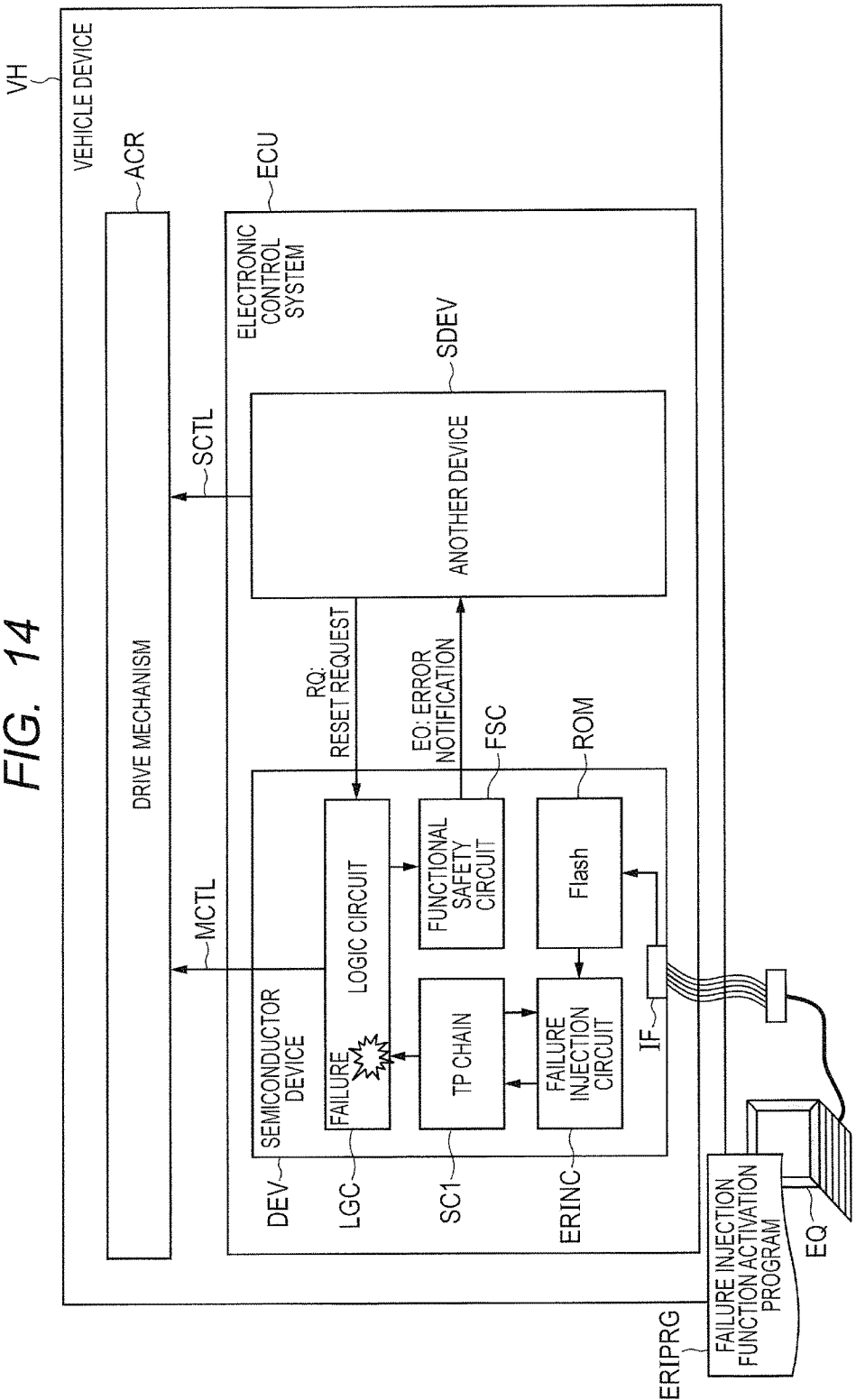
FIG. 14 is a diagram showing an outline configuration example of a vehicle device to which an electronic control system is applied according to a fourth embodiment of the present invention.

FIG. 14 is a diagram showing an outline configuration example of a vehicle device to which an electronic control system is applied according to a fourth embodiment of the present invention. Typically, a vehicle device VH shown in FIG. 14 is a car or other vehicle. The vehicle device VH is comprised of an electronic control system ECU and a drive mechanism ACR corresponding to various actuators such as an engine and a brake. The electronic control system ECU includes, for example, a semiconductor device DEV, a wiring substrate on which another device SDEV or the like is mounted, and the like. The configurations described in the first to third embodiments are applied to the semiconductor device DEV.

The semiconductor device DEV shown in FIG. 14 generally includes a logic circuit LGC, a TP chain SC1, a failure injection circuit ERINC, a functional safety circuit FSC, and a non-volatile memory ROM such as a flash memory. In the normal operation, the drive mechanism ACR performs a predetermined operation based on a control signal MCTL from the semiconductor device (or more specifically, from the logic circuit LGC thereof), to run the vehicle device VH. On the other hand, when a failure occurs in the logic circuit LGC, the functional safety circuit FSC detects the failure and transmits, for example, an error notification EO including the content of the error or other information, to another device SDEV.

Upon receiving the error notification EO, for example, another device SDEV issues a reset request RQ to the semiconductor device (or more specifically, to the logic circuit thereof). At the same time, another device SDEV outputs a control signal SCTL including a control switching instruction to the drive mechanism ACR. Based on the control signal SCTL from another device SDEV, the drive mechanism ACR stops the operation based on the control signal MCTL from the semiconductor device DEV, and instead performs the operation based on the control signal SCTL. At this time, although not particularly limited thereto, another device SDEV outputs the control signal SCTL to continue to run the vehicle device VH, or outputs the control signal SCTL to safely stop the vehicle device VH, according to the error content or the like included in the error notification EO. In this way, when a failure occurs in the semiconductor device DEV, the electronic control system ECU performs a predetermined operation associated with functional safety.

Figure 15:
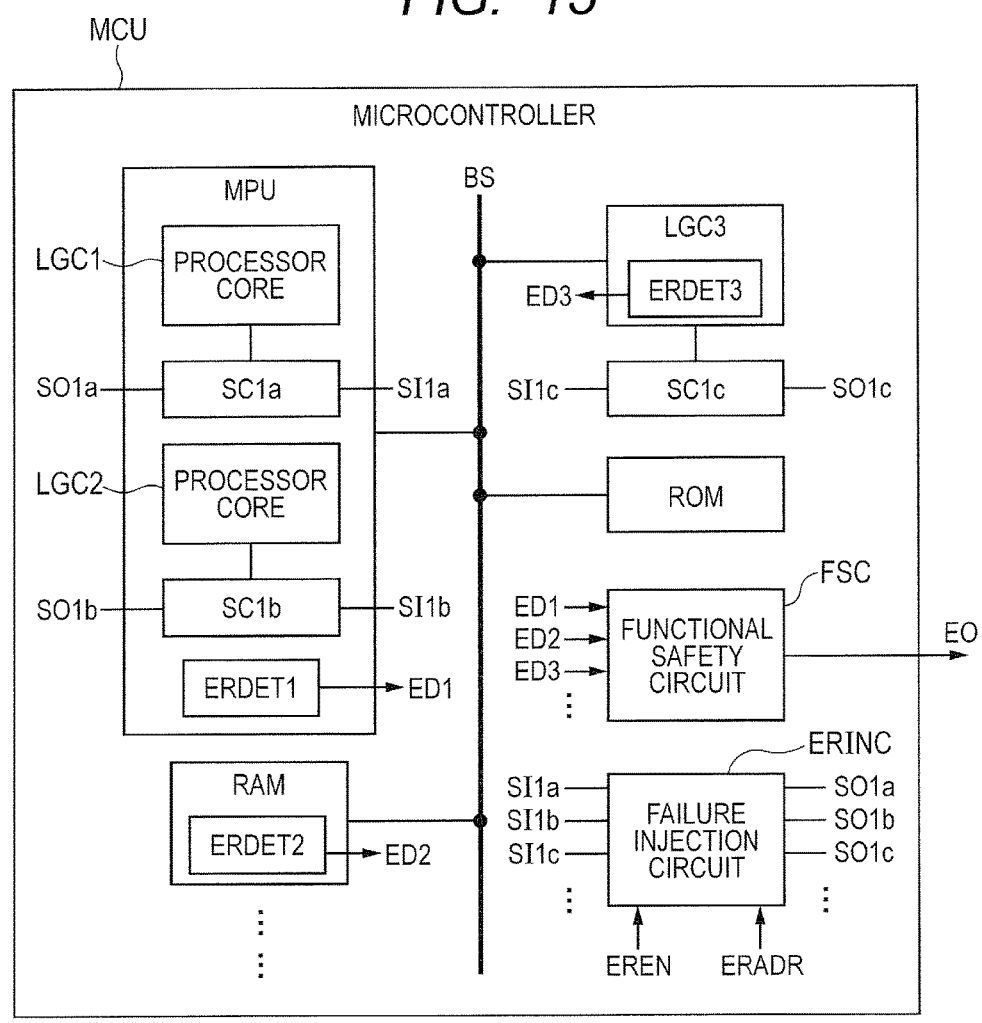
FIG. 15 is a circuit block diagram showing a detailed configuration example of the semiconductor device in the electronic control system of FIG. 14.

FIG. 15 is a detailed circuit block diagram showing a configuration example of the semiconductor device in the electronic control system shown in FIG. 14. For example, a microcontroller MCU is typically mounted, as a semiconductor device DEV, on the electronic control system ECU for a vehicle. The microcontroller MCU includes, for example, a plurality of logic circuits LGC1 to LCG3, a volatile memory RAM, a non-volatile memory ROM, and the like, all of which are coupled by an internal bus BS as shown in FIG. 15.

In this example, both the logic circuits LGC1 and LGC2 are processor cores with the same circuit configuration, which form a lock step dual core MPU comprised of a master core and a checker core. The lock step dual core MPU includes a failure detection circuit ERDET1 that detects a failure of the master core by comparing the outputs of the master core and the checker core. The volatile memory RAM includes a failure detection circuit ERDET2 that detects Error Check and Correct (ECC) error or other type of error. Also, the logic circuit LGC3 includes a failure detection circuit ERDET3 that detects a failure by a predetermined method. Although not particularly limited thereto, the logic circuit LGC3 corresponds to various accelerator circuits, various communication interfaces circuits, and the like.

The microcontroller MCU of FIG. 15 further includes a plurality of TP chains SC1a, SC1b, and SC1c, a functional safety circuit FSC, and a failure injection circuit ERINC. The TP chains SC1a, SC1b, and SC1c respectively correspond to the logic circuits LGC1, LGC2, and LGC3. The failure injection circuit ERINC is coupled to scan-in nodes SI1a, SI1b, SI1c of the TP chain SC1a, SC1b, SC1c and to scan-out nodes SO1a, SO1b, SO1c of the TP chain SC1a, SC1b, SC1c, respectively. The functional safety circuit FSC receives failure detection signals ED1 to ED3 from the failure detection circuits ERDET1 to ERDET3, and transmits the error notification EO to the outside. Further, the functional safety circuit FSC performs issuing an internal reset signal, or other operations, in response to the failure detection signal ED1 to ED3.

<Evaluation Method of Electronic Control System>

FIG. 16 is a flow chart illustrating an example of the evaluation method in the electronic control system according to the fourth embodiment of the present invention. In FIG. 16, first the method allows the semiconductor device DEV1 (or more specifically, the logic circuit LGC thereof) to perform the normal operation (step S401). Next, the method sets failure data to the TP chain SC1 through the scan-in node to inject a failure into the target node within the logic circuit LGC during the normal operation of the logic circuit LGC (step S402). Then, the method verifies the behavior of the electronic control system ECU after the injection of the failure (step S403). More specifically, for example, the method verifies whether or not another device SDEV operates as it is designed.

Here, in step S402, for example in FIG. 15, it is possible to appropriately select the logic circuits LGC1, LGC2, or LGC3 as the failure injection destination, by selecting the TP chain SC1a, SC1b, or SC1c in which the failure data is set. Further, in the example of FIGS. 14 and 15, the failure injection circuit ERINC is provided within the semiconductor device DEV. However, in some cases, the failure injection circuit ERINC can also be provided in the outside of the semiconductor device DEV (for example, on the wiring substrate of the electronic control system or in an external test device).

In this case, for example, the semiconductor device DEV is configured such that the external failure injection circuit can access the scan-in node SI1 of the TP chain SC1 through the JTAG interface or other means of the semiconductor device DEV. In this case, however, there is concern about the increase in the burden of the evaluator of the electronic control system ECU or other person, the reduction in the security caused by allowing the direct access to the TP chain SC1 from the outside, or other disadvantages. Thus, from this perspective, it is desirable that the failure injection circuit ERINC is mounted within the semiconductor device DEV.

Steps S401 and S402 in FIG. 16 will be described in detail below, focusing on the case in which the failure injection circuit ERINC is mounted within the semiconductor device DEV. First, in a state in which the vehicle device VH is stopped, the evaluator or other person couples information processing equipment EQ to the external interface IF of the semiconductor device DEV, and performs a failure injection function activation program ERIPRG stored in the information processing equipment EQ in advance.

The failure injection function activation program ERIPRG is the program that rewrites the non-volatile memory RON of the semiconductor device DEV. With this program, the evaluator or other person can write the failure injection flag on which the failure injection enable signal EREN is based, the failure address ERADR, and the failure injection condition ERCND into a predetermined memory area of the non-volatile memory ROM as described in the first to third embodiments. For example, when the microcontroller MCU shown in FIG. 15 is used, it is possible to select the TP chain SC1a, SC1b, or SC1c and to select the test point TP within the selected TP chain by using the failure injection address ERADR.

Next, the evaluator or other person powers on the vehicle device VH as usual, to allow the vehicle device VH and the electronic control system ECU to perform the normal operation. In response to this, for example, the lock step dual core MPU shown in FIG. 15 executes a boot program on the non-volatile memory ROM, asserts the failure injection enable signal EREN in the boot program, and outputs the failure injection address ERADR and the failure injection condition ERCND to the failure injection circuit ERINC.

Then, the lock step dual core MPU proceeds to the normal operation through the boot program, and executes the body program or the like on the non-volatile memory ROM (step S401). On the other hand, the failure injection circuit ERINC operates independently of the execution of such a body program. As described in the first to third embodiments, the failure injection circuit ERINC injects a failure into the target node of the logic circuit LGC through the TP chain SC1 during the normal operation of the logic circuit LGC that is the failure injection destination (step S402).

With this configuration, it is possible to allow the evaluator or other person to easily evaluate the electronic control system ECU to which functional safety is applied as well as the vehicle device VH, without increasing the burden of the evaluator or other person. Similarly, it is possible to allow the developer of the electronic control system ECU or other person to easily debug programs, such as the body program of the semiconductor device DEV, and the body program of another device SDEV, while injecting failures.

The invention made by the present inventors has been described in detail based on the embodiments. However, the present invention is not limited to the foregoing embodiments, and various modifications can be made without departing form the scope of the invention as defined in the appended claim. For example, the exemplary embodiments have been described in detail for a better understanding of the present invention, and the present invention is not necessarily limited to those with all of the configurations described above. Further, part of the configuration of an embodiment can be replaced with the configuration of any other embodiments, and the configuration of an embodiment can be added to the configuration of any other embodiments. Furthermore, addition, deletion, or replacement of other configurations is permitted to be performed on part of the configuration of each embodiment.

Here, the electronic control system for vehicle has been described as an example, but, of course, the present invention is not limited to this example. For example, the present invention can also be applied to systems for various types of industrial equipment that require relatively high safety. Further, here, the failure injection enable signal EREN as well as the timer circuit TMR are used as a method for determining the failure injection timing. However, the method can accordingly be changed to other methods, such as, for example, the use of a trigger signal from the outside of the semiconductor device DEV.

What is claimed is:

1. A semiconductor device comprised of a single semiconductor chip, the semiconductor device comprising:
   a logic circuit configured to perform a predetermined function;
   a first scan chain comprising a plurality of test point flip-flops sequentially coupled to each other; and
   a failure injection circuit that injects a failure into a target node within the logic circuit during a normal operation of the logic circuit, by generating failure data and setting the failure data to the first scan chain through a scan-in node of the first scan chain,
   wherein the target node within the logic circuit is fixed to a predetermined logic level based on one of the test point flip-flops holding a value corresponding to the failure.

2. The semiconductor device according to claim 1,
   wherein the logic circuit performs the normal operation with values held in a plurality of logic circuit flip-flops, and
   wherein the semiconductor device comprises a second scan chain configured by sequentially coupling the logic circuit flip-flops.

3. The semiconductor device according to claim 2,
   wherein the failure data or a mass production test pattern for performing a scan test of the logic circuit is input to the scan-in node of the first scan chain.

4. The semiconductor device according to claim 3,
   wherein the semiconductor device comprises a first selection circuit that selects, when the failure data is input to a first input node of the first selection circuit and the mass production test pattern is input to a second input node of the first selection circuit, between the first input node and the second input node to couple to the scan-in node, and
   wherein the failure injection circuit controls the first selection circuit to select the first input node.

5. The semiconductor device according to claim 4,
   wherein the semiconductor device comprises a mass-production test pattern generation circuit that performs the scan test of the logic circuit, by generating the mass production test pattern, outputting a part of the mass production test pattern to the scan-in node of the first scan chain, and outputting the other part of the mass production test pattern to the scan-in node of the second scan chain.

6. The semiconductor device according to claim 4,
   wherein the semiconductor device comprises a second selection circuit that selects, when the failure data from the failure injection circuit is input to a third input node of the second selection circuit and a scan-out node of the first scan chain is coupled to a fourth input node of the second selection circuit, between the third input node and the fourth input node to couple to the first input node.

7. The semiconductor device according to claim 6, wherein the failure injection circuit performs the processes of:
generating the failure data so that one of the test point flip-flops holds the value corresponding to the failure by controlling the second selection circuit to select the third input node; and
injecting the failure while changing the target node within the logic circuit, by controlling the second selection circuit to select the fourth input node, and by allowing the test point flip-flop holding the value corresponding to the failure to circulate while scanning by shifting the first scan chain.

8. The semiconductor device according to claim 7, wherein the failure injection circuit comprises a control circuit that determines a period in which the failure is injected in the failure injection while changing the target node within the logic circuit, and determines an interval in which the failure is injected according to the setting.

9. The semiconductor device according to claim 1, wherein the failure injection circuit generates the failure data so that one of the test point flip-flops holds the value corresponding to the failure.

10. The semiconductor device according to claim 9, wherein the failure injection circuit comprises a control circuit that determines a period in which the failure is injected into the target node within the logic circuit according to the setting.

11. An electronic control system comprising:
a semiconductor device that is comprised of a single semiconductor chip, configured to perform a computer operation associated with functional safety in an event of an occurrence of a failure in the semiconductor device,
wherein the semiconductor device comprises:
   a logic circuit configured to perform a predetermined function; and
   a scan chain comprising a plurality of test point flip-flops sequentially coupled to each other, and
wherein the electronic control system further comprises:
   a failure injection circuit that injects a failure into a target node within the logic circuit during a normal operation of the logic circuit, by generating failure data and by setting the failure data to the scan chain through a scan-in node of the scan chain,
   wherein the target node within the logic circuit is fixed to a predetermined logic level based on one of the test point flip-flops holding a value corresponding to the failure.

12. The electronic control system according to claim 11, wherein the failure data, or a mass production test pattern for performing a scan test of the logic circuit upon testing the semiconductor device, is input to the scan-in node of the scan chain.

13. The electronic control system according to claim 11, wherein the failure injection circuit is provided in the semiconductor device.

14. The electronic control system according to claim 13, wherein the failure injection circuit generates the failure data so that the one of the test point flip-flops holds the value corresponding to the failure.

15. The electronic control system according to claim 14, wherein the failure injection circuit comprises a control circuit that determines a period in which the failure is injected into the target node within the logic circuit according to the setting.

16. The electronic control system according to claim 13, wherein the semiconductor device comprises a selection circuit that selects, when the failure data from the failure injection circuit and the scan-out node of the scan chain are respectively coupled to a plurality of input nodes of the selection circuit, between the plurality of the input nodes to couple to the scan-in node of the scan chain.

17. The electronic control system according to claim 16, wherein the failure injection circuit performs the processes of:
generating the failure data so that one of the test point flip-flops holds the value corresponding to the failure by controlling the selection circuit to select the failure data side; and
injecting the failure while changing the target node within the logic circuit, by controlling the selection circuit to select the scan-out node side, and by allowing the test point flip-flop holding the value corresponding to the failure to circulate while scanning by shifting the scan chain.

18. The electronic control system according to claim 17, wherein the failure injection circuit comprises a control circuit that determines a period in which the failure is injected in the failure injection while changing the target node within the logic circuit, and determines an interval in which the failure is injected according to the setting.

19. The electronic control system according to claim 13, wherein the semiconductor device comprises a non-volatile memory to which an arbitrary value is written from outside of the semiconductor device, and
wherein the failure injection circuit operates when a predetermined value is stored in a predetermined memory area of the non-volatile memory.

20. An evaluation method of an electronic control system equipped with a semiconductor device that is comprised of a single semiconductor chip,
wherein the semiconductor device comprises:
   a logic circuit configured to perform a predetermined function; and
   a scan chain configured by sequentially coupling each of a plurality of test point flip-flops, in which either a mass production test pattern for performing a scan test of the logic circuit, or failure data for making the logic circuit into a failed state, is input to a scan-in node, wherein a target node within the logic circuit is fixed to a predetermined logic level based on one of the test point flip-flops holding a value corresponding to the failed state,
wherein the method comprises:
allowing the logic circuit to perform a normal operation;
injecting a failure into the target node within the logic circuit during the normal operation of the logic circuit, by setting the failure data to the scan chain through the scan-in node; and verifying a behavior of the electronic control system after the injection of the failure into the logic circuit.

* * * * *